US006873196B2

(12) United States Patent
Humphrey

(10) Patent No.: US 6,873,196 B2
(45) Date of Patent: Mar. 29, 2005

(54) SLEW RATE CONTROL OF OUTPUT DRIVERS USING FETS WITH DIFFERENT THRESHOLD VOLTAGES

(75) Inventor: Guy Harlan Humphrey, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/921,022

(22) Filed: Aug. 2, 2001

(65) Prior Publication Data

US 2003/0025542 A1 Feb. 6, 2003

(51) Int. Cl.[7] .............................................. H03K 5/12
(52) U.S. Cl. ...................... 327/170; 327/112; 326/87
(58) Field of Search .................. 327/170, 108–112, 327/374–378, 379–384, 389, 391, 387, 362, 436, 437, 513, 83; 307/412; 326/26–27, 82–92, 17, 20, 23–28, 31–34, 30, 49, 50, 112, 120; 365/189.05

(56) References Cited

U.S. PATENT DOCUMENTS

| 4,386,286 A | * | 5/1983 | Kuo ............................ 326/120 |
| 4,639,615 A | * | 1/1987 | Lee et al. ..................... 327/170 |
| 5,036,222 A | * | 7/1991 | Davis ........................... 326/27 |
| 5,568,062 A | * | 10/1996 | Kaplinsky ..................... 326/27 |
| 5,581,197 A | | 12/1996 | Motley et al. ................. 326/30 |
| 5,747,854 A | * | 5/1998 | Gotou ......................... 257/368 |
| 5,877,647 A | * | 3/1999 | Vajapey et al. ................ 326/27 |
| 6,515,528 B1 | * | 2/2003 | Tohsche ...................... 327/203 |

* cited by examiner

Primary Examiner—Minh Nguyen

(57) ABSTRACT

A novel method and apparatus is presented for reducing the slew rate of transition edges of a digital signal on a node of an integrated circuit by connecting transistors with differing threshold voltages between the node and a voltage source and driving the gates of these transistors with the same driving signal.

13 Claims, 4 Drawing Sheets

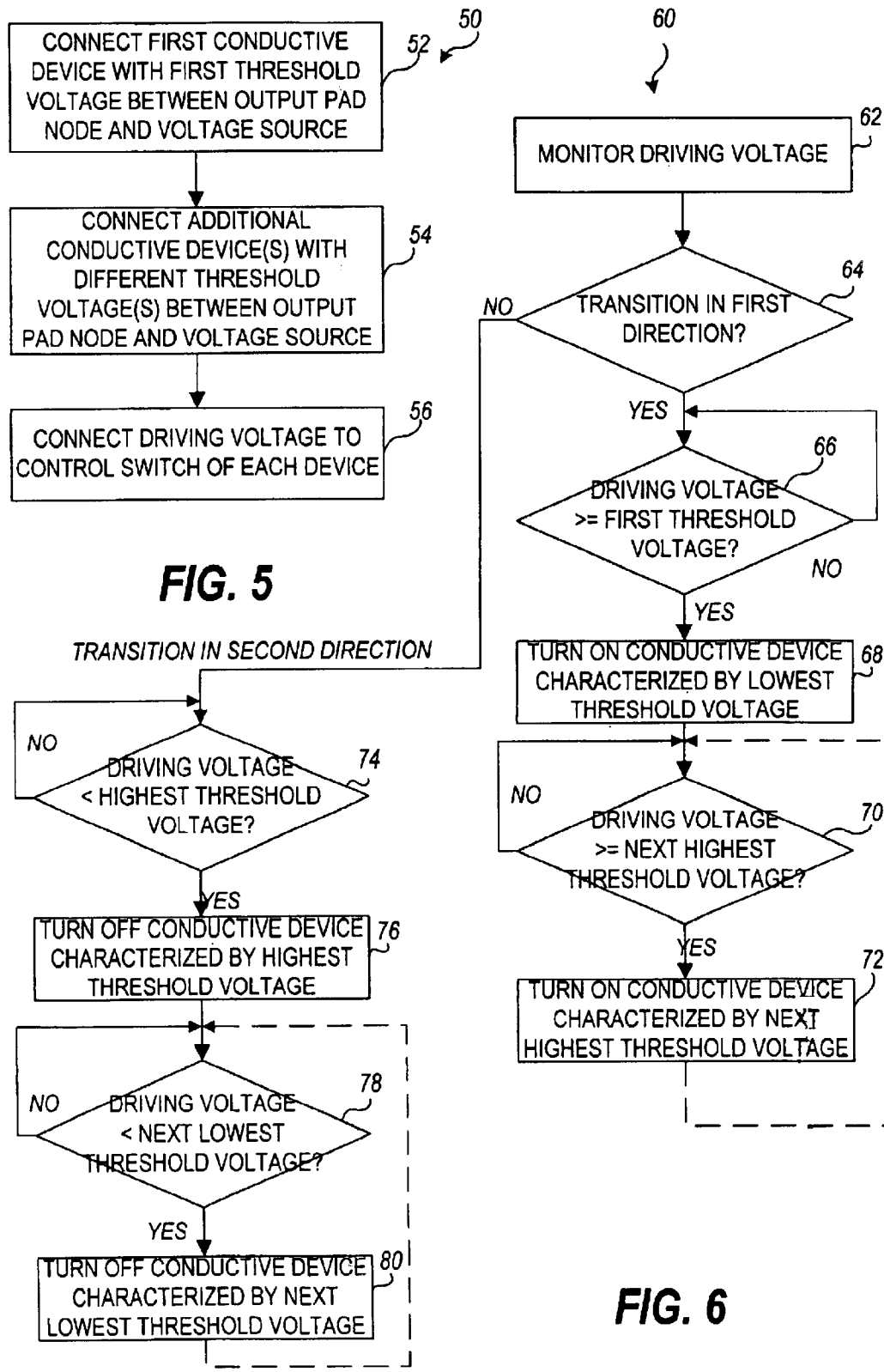

SLEW RATE CONTROL OF OUTPUT DRIVERS USING FETS WITH DIFFERENT THRESHOLD VOLTAGES

FIELD OF THE INVENTION

The present invention relates generally to integrated circuit pad circuits, and more particularly to controlling the slew rate of output drivers using transistors with differing threshold voltages.

BACKGROUND OF THE INVENTION

Integrated circuits communicate with one another using digital signals. In the digital world, a digital signal may be in one of a plurality of predefined quantized states. Because digital signals are transmitted using an analog signal along a transmission line, the predefined quantized states of the digital signal are represented by different ranges of voltages within the total voltage range of the signal. For example, a typical digital integrated circuit (IC) will communicate using two states—zero and one. The digital state of zero is represented by the range of voltages between a minimum voltage $V_{MIN}$ (e.g., 0 volts) of the potential voltage range of the signal and a voltage $V_{LOW}$ that is low relative to the total range of voltage, whereas the digital state of one is represented by the range of voltages between a voltage $V_{HIGH}$ that is high relative to the total range of voltages and a maximum voltage $V_{MAX}$ (e.g., 1.5 volts) of the potential voltage range of the signal. In this example, the state of the digital signal is unknown when the voltage level of the signal is between $V_{LOW}$ and $V_{HIGH}$, which typically only occurs during transitions of the signal from either the zero state to the one state or vice versa.

Because the transmission signal is actually analog, the transition between digital states does not occur instantaneously, but instead occurs over a period of time $T_{TRANSITION}$ that is dependent on the physical conditions present on the transmission line. It is well known that signal transitions over a transmission line will suffer a delay known as a propagation delay due to the parasitic resistance, inductance, and capacitance of the line. This delay increases with the length of the line. In addition, it is also well-known that unless the impedance of the transmission line matches that of the load it drives, the signal will degrade because the mismatch in impedance leads to reflections from the load that are passed back to the driver circuit. The driver circuit then re-reflects the reflection causing further signal degradation.

Unfortunately, when the driver circuit drives multiple loads with differing impedances, the transmission line requires multiple stubs to properly match each of the loads during realtime operation. However, the use of multiple stubs then generates multiple reflections. One way of ensuring proper detection of signal states is to control the edge rates of the signal.

However, this competes with the trend towards ever increasing signal frequencies, which results in higher edge rates. Accordingly, a need exists for a technique for controlling the slew rate of signal edge transitions without sacrificing the signal frequency.

SUMMARY OF THE INVENTION

The present invention is a method and circuit for controlling the slew rate of integrated circuit output drivers using transistors with differing threshold voltages to allow a stepped-stage slew rate on the transition edges of a digital signal.

In accordance with the method of the invention, a number of switchably conductive devices such as FETs each characterized by a different threshold voltage are connected in parallel between a transmission line node such as the output pad and a voltage source. Each conductive device is controllable at a respective switch using a common driving signal. Accordingly, when the driving signal transitions from one digital state to another, the conductive devices will each turn on or off (depending on the direction of the signal transition) in turn to generate a stepped control of the slew rate of the signal edge on the node.

BRIEF DESCRIPTION OF THE DRAWING

The invention will be better understood from a reading of the following detailed description taken in conjunction with the drawing in which like reference designators are used to designate like elements, and in which:

FIG. 5 is an operational flowchart of an exemplary embodiment of a method in accordance with the invention for implementing a circuit for controlling the slew rate of output drivers by using transistors with differing threshold voltages to achieve a stepped-stage slew rate on the edges of the signal transitions; and FIG. 6 is an operational flowchart of a method for operating a circuit built in accordance with FIG. 5.

DETAILED DESCRIPTION

A novel method and circuits for controlling the slew rate of output drivers using transistors with differing threshold voltages is described in detail hereinafter. Although the invention is described in terms of specific illustrative embodiments, such as specific output driver designs, it is to be understood that the embodiments described herein are by way of example only and the scope of the invention is not intended to be limited thereby but is intended to extend to any embodiment incorporating any number of transistors of any type with differing threshold voltages that results in stepped-stage slew rate on the edges of signal transitions.

Figure 1A:
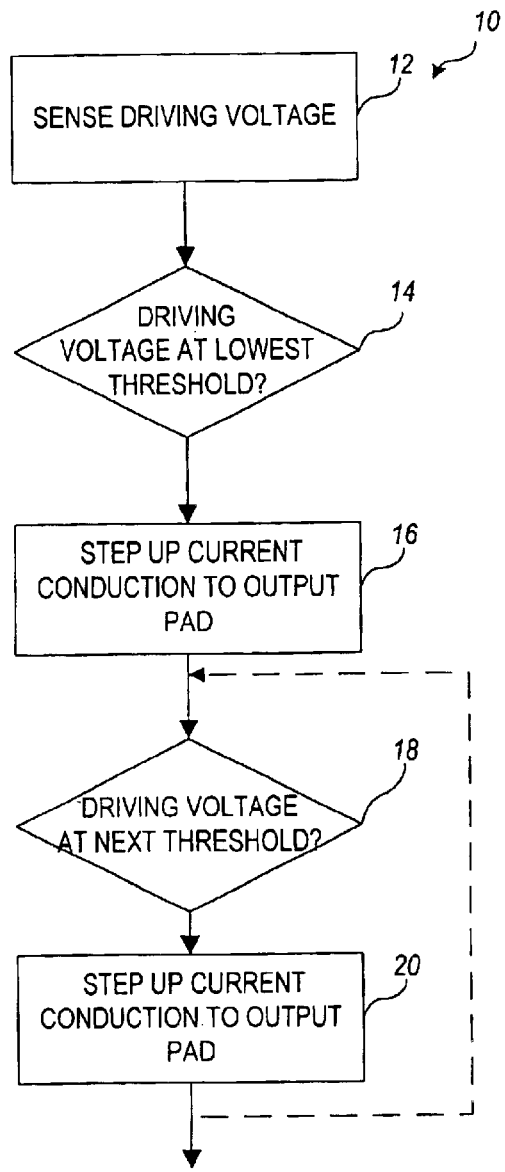
FIG. 1A is an operational flowchart of a method for adjusting the amount of current conducted to the output pad in order to slow down the edge rate of the signal on the output pad by incrementally increasing the amount of current conducted to the output pad.
Figure 1B:
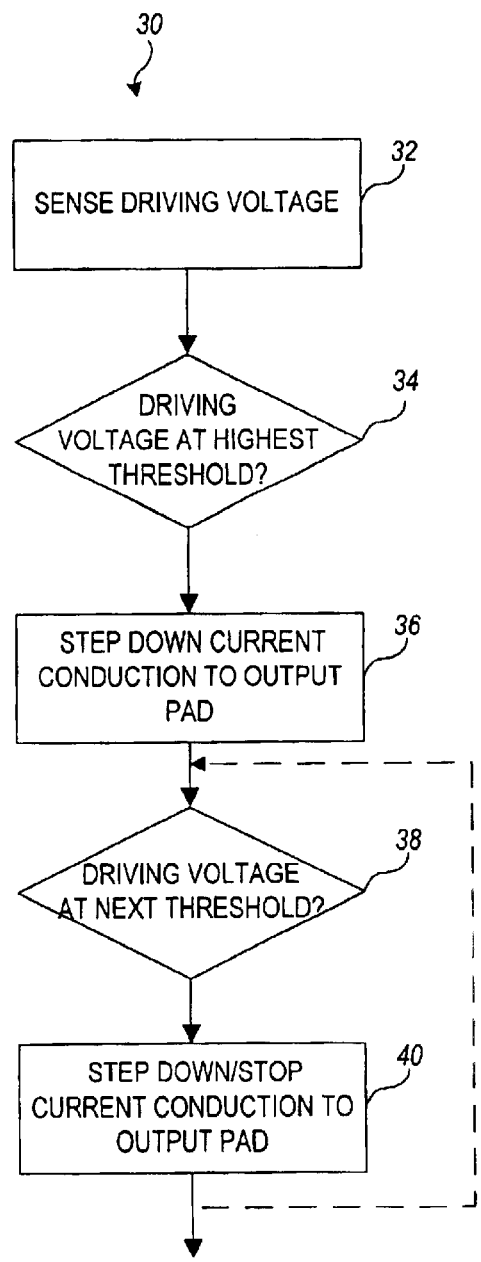
FIG. 1B is an operational flowchart of a method for adjusting the amount of current conducted to the output pad by incrementally decreasing the amount of current conducted to the output pad.

Turning now in detail to the drawing, FIGS. 1A and 1B illustrate an exemplary embodiment of methods in accordance with the invention for controlling the slew rate of output drivers by using transistors with differing threshold voltages to achieve a stepped-stage slew rate on the edges of the signal transitions. In particular, the invention employs switchably conductive devices such as field effect transistors (FETs) with varying threshold voltages. It is known in the art that FETs may be designed with varying specifications. For example, the FETs most commonly used in integrated circuits due to their lower voltage ratings have a threshold voltage between 0.4–0.5 volts. FETs designed for use in higher power applications typically have a threshold voltage between 0.6 and 0.7 volts. This 200–300 mV difference is used to advantage in the present invention to achieve a stepped-stage slew rate on the signal edges as discussed hereinafter.

FIG. 1A illustrates a method 10 for adjusting the amount of current conducted to the output pad in order to slow down the edge rate of the signal on the output pad by incrementally increasing the amount of current conducted to the output pad. As shown in FIG. 1A, the driving voltage, which controls the amount of current to conduct to the output pad, is sensed 12. When the driving voltage reaches a first threshold, for example voltage corresponding to the lowest threshold voltage of all conductive devices coupled to the output pad, as determined in step 14, the amount of current conducted to the pad is stepped up 16, for example from no current conduction to a first increment of conduction. When the driving voltage reaches a next threshold, for example voltage corresponding to the next highest threshold voltage of all conductive devices coupled to the output pad, as determined in step 18, the amount of current conducted to the pad is stepped up 20 to a higher level. Steps 18 and 20 may be repeated for additional higher threshold voltage levels of additional conductive devices coupled to the output pad.

FIG. 1B illustrates a method 30 for adjusting the amount of current conducted to the output pad in order to slow down the edge rate of the signal on the output pad by incrementally decreasing the amount of current conducted to the output pad. As shown in FIG. 1B, the driving voltage, which controls the amount of current to conduct to the output pad, is sensed 32. When the driving voltage reaches a first threshold, for example voltage corresponding to the highest threshold voltage of all conductive devices coupled to the output pad, as determined in step 34, the amount of current conducted to the pad is stepped down 36, for example from maximum current conduction to a smaller amount of conduction. When the driving voltage reaches a next threshold, for example voltage corresponding to the next lowest threshold voltage of all conductive devices coupled to the output pad, as determined in step 38, the amount of current conducted to the pad is stepped down 40 to a lower level. Steps 38 and 40 may be repeated for additional lower threshold voltage levels of additional conductive devices coupled to the output pad.

As will become apparent in the description hereinafter, the two methods 10 and 30 may alternatively operate to drive a single data signal.

Figure 2:
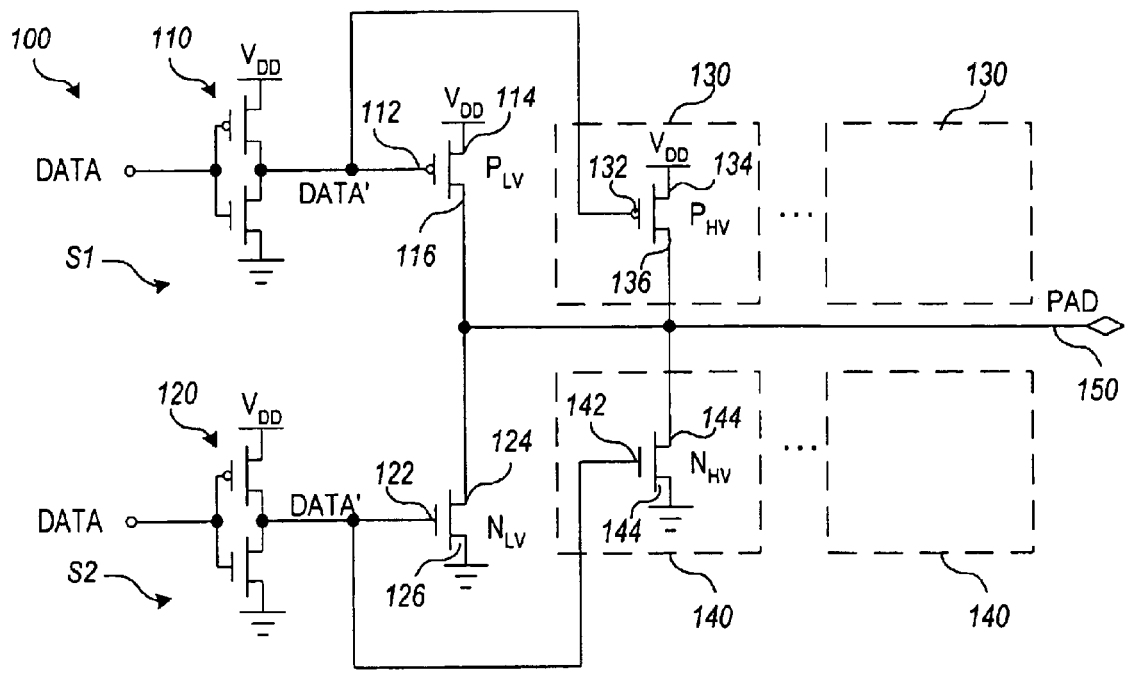
FIG. 2 is a schematic diagram of a slew-rate controlled output driver circuit implemented in accordance with the invention.

Turning now to a specific preferred embodiment, FIG. 2 depicts a slew rate controlled output driver circuit 100 in accordance with the present invention. As will be described in detail hereinafter, the slew-rate controlled output driver circuit 100 of FIG. 2 provides the functionality for controlling the slew rate of the signal driven onto the output pad by performing a step-controlled edge transition.

As known in the art, a typical output driver will include at least an inverter 110 having an input coupled to receive a data signal and an output coupled to the gate of a transistor whose drain is coupled to an output pad 150 and whose source is coupled to either a high voltage source (e.g., $V_{DD}$) for driving the output pad to a high voltage level, or a low voltage source (e.g., $V_{SS}$ or ground) for driving the output pad to a low voltage level. In the illustrative embodiment of FIG. 2, the circuitry is implemented using field effect transistors (FETs). Furthermore, the output driver 100 includes two stages: drive high stage S1 and drive low stage S2.

As shown, drive high stage S1 includes a first inverter 110 which receives data signal DATA. The output of the inverter is connected to the gate of a low-voltage p-channel FET (PFET) $P_{LV}$ and to the gate of a high-voltage PFET $P_{HV}$. The sources of PFETs $P_{LV}$ and $P_{HV}$ are each connected to the circuit high-voltage source $V_{DD}$, and their drains are each connected to the pad node 150.

Drive low stage S2 includes a second inverter 120 which also receives data signal DATA. The output of the inverter is connected to the gate of a low-voltage n-channel FET (NFET) $N_{LV}$ and to the gate of a low-voltage NFET $N_{HV}$. The sources of NFETs $N_{LV}$ and $N_{HV}$ are each connected to the circuit ground, and their drains are each connected to the pad node 150.

Figure 3A:
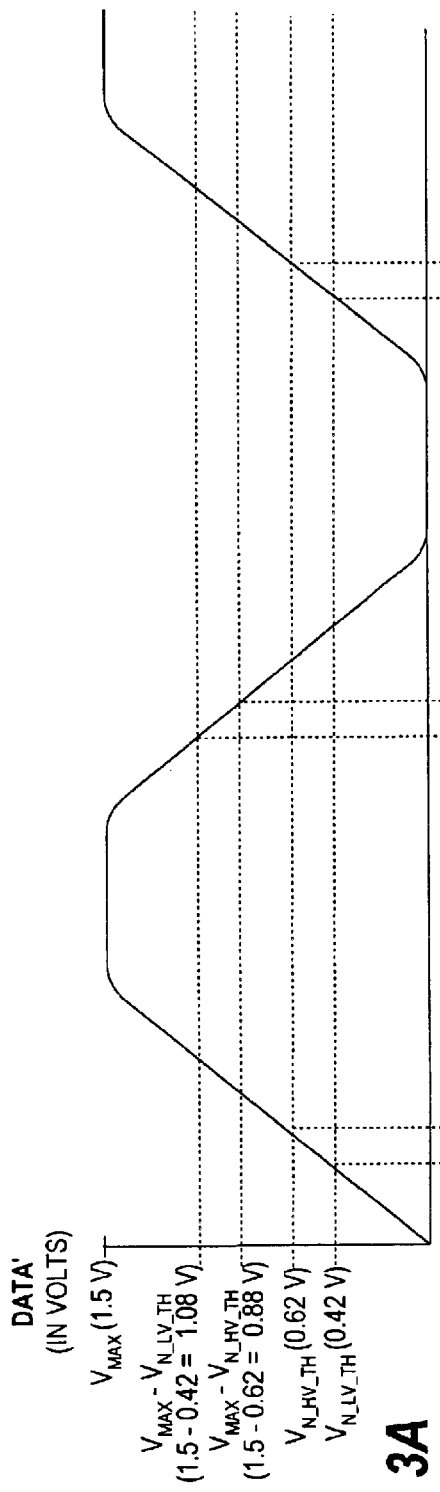
FIG. 3A is a voltage-vs.-timing diagram illustrating a driving voltage signal.
Figure 3B:
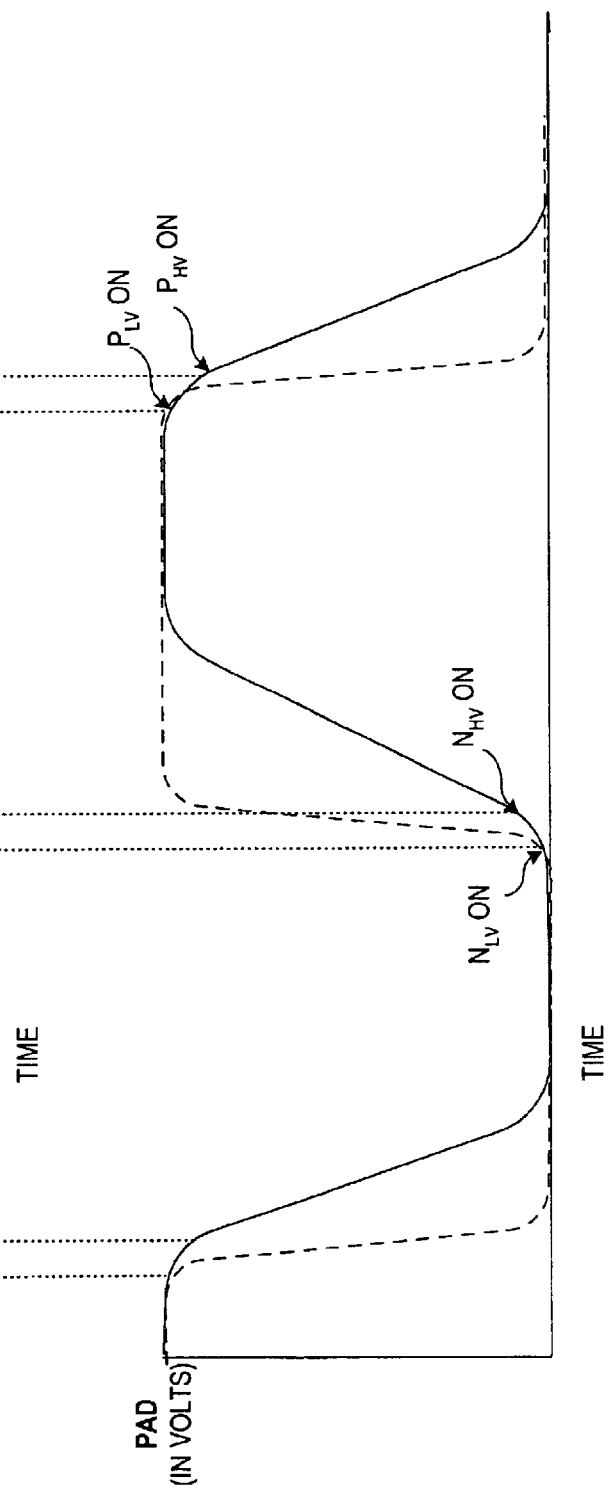
FIG. 3B is a voltage-vs.-timing diagram illustrating the output signal seen on the output pad as a result of the driving voltage signal of FIG. 3A.

Referring now also to FIGS. 3A and 3B in conjunction with FIG. 2, in operation, when the data signal DATA transitions from a low to a high voltage level, inverters 110 and 120 will both output a low voltage level. Accordingly, a low voltage level is applied to the gates of PFETs $P_{LV}$ and $P_{HV}$, turning them both on, in a staged manner, to source a high-voltage level VDD onto the pad node 150. Because low-voltage PFET $P_{LV}$ is characterized by a lower threshold voltage than high-voltage PFET $P_{HV}$, PFET $P_{LV}$ will turn on sooner than PFET $P_{HV}$, as illustrated at $P_{LV\_ON}$ and $P_{HV\_ON}$ in FIG. 3A. Since PFETs $P_{LV}$ and $P_{HV}$ operate as resistors coupled in parallel, the voltage level on the output pad, shown in FIG. 3B, transitions more slowly during the period of time when only the low-voltage PFET is on, and more quickly when the high-voltage PFET turns on. Accordingly, the addition of the high-voltage PFET $P_{HV}$ in parallel with the low-voltage PFET $P_{LV}$ allows a stepped-stage slew rate of the edge transition, where the slew rate of each stage is controlled by the sizing of the low- and high-voltage PFETs $P_{LV}$ and $P_{HV}$.

Whenever the data signal DATA is high, resulting in a low voltage level output by inverters 110 and 120 and the application of a low voltage level to the gates 112 and 132 of PFETs $P_{LV}$ and $P_{HV}$, a low voltage level is simultaneously applied to the gates 122 and 142 of NFETs $N_{LV}$ and $N_{HV}$. The application of the low voltage levels to the gates 122 and 142 of NFETs $N_{LV}$ and $N_{HV}$ turns off NFETs $N_{LV}$ and $N_{HV}$ to isolate the pad node 150 from ground when the pad is being driven high. Because low-voltage NFET $P_{LV}$ is characterized by a lower threshold voltage than high-voltage NFET $P_{HV}$, high-voltage NFET $N_{HV}$ will turn off sooner than low-voltage NFET $N_{LV}$, as illustrated at $N_{LV\_ON}$ and $N_{HV\_ON}$ in FIG. 3A. Just as in the case of the high-voltage PFETs $P_{LV}$ and $P_{HV}$, low-voltage NFETs $N_{LV}$ and $N_{HV}$ operate together as resistors coupled in parallel. Accordingly, the voltage level on the output pad 150 (shown in FIG. 3B) transitions more quickly during the period of time when both the high-and low-voltage NFETs $N_{HV}$ and $N_{LV}$ are on and more slowly when only the low-voltage NFET $N_{LV}$ is on. Accordingly, the use of the high-voltage NFET $N_{HV}$ in parallel with the low-voltage NFET $N_{LV}$ results in a stepped-stage slew rate of the edge transition, where the slew rate of each transition stage is controlled by the sizing of the low- and high-voltage NFETs $N_{LV}$ and $N_{HV}$ (together with the sizing of the low- and high-voltage PFETs $P_{LV}$ and $P_{HV}$).

When the data signal DATA transitions to a low voltage level, inverters 110 and 120 will both output a high voltage level. Accordingly, a high voltage level is applied by inverter 110 to the gates of PFETs $P_{LV}$ and $P_{HV}$, turning them both off, in a staged manner, to isolate the high-voltage level VDD from the pad node 150. Again, because low-voltage PFET $P_{LV}$ is characterized by a lower threshold voltage than high-voltage PFET $P_{HV}$, PFET $P_{HV}$ will turn off sooner than PFET $P_{LV}$, resulting in a stepped-stage slew rate of the edge transition as shown in FIGS. 3A and 3B.

Simultaneously, the high voltage level output by inverter 120 is applied to the gates 122 and 142 of NFETs $N_{LV}$ and $N_{HV}$. The application of the high voltage level to the gates 122 and 142 of NFETs $N_{LV}$ and $N_{HV}$ turns on NFETs $N_{LV}$ and $N_{HV}$ to pull the pad node 150 to ground in a stepped-stage manner due to the difference in threshold voltages of low-voltage NFET $P_{LV}$ and high-voltage NFET $P_{HV}$. In particular, the voltage level on the output pad 150 transitions to ground more quickly when both the high- and low-voltage NFETs $N_{HV}$ and $N_{LV}$ are on and more slowly when only the low-voltage NFET $N_{LV}$ is on.

FIG. 3B shows the output signal PAD seen on pad node 150 with and without the invention. As shown, in the prior art, without the additional high-voltage transistors $P_{HV}$ and $N_{HV}$ of the invention, the output signal edge transitioned fully once the threshold voltage of the respective transistors was reached (as limited by the size (i.e., resistance) of the transistor). By staging the transition using transistors with different threshold voltages, the edge transition can be slowed down by essentially delaying the full transition.

It will be appreciated that the number of transistors with differing threshold voltages and connected as shown at 130 and 140 in FIG. 2 can be increased to add further stepped stages, and therefore additional control, of the edge transitions of the signal.

Figure 4:
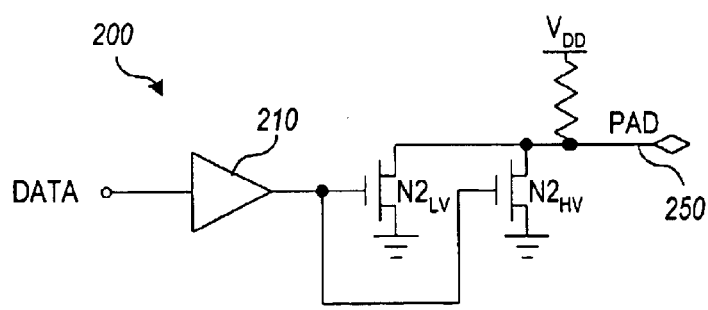
FIG. 4 is an alternative embodiment of a slew rate controlled output driver circuit implemented in accordance with the invention.

FIG. 4 is an alternative embodiment of a slew rate controlled output driver circuit 200 in accordance with the invention. In this embodiment, output driver 200 includes an inverter 210 which receives data signal DATA. The output of the inverter is connected to the gate of a low-voltage NFET $N2_{LV}$ and to the gate of a high-voltage NFET $N2_{HV}$. The sources of NFETs $N2_{LV}$ and $N2_{HV}$ are each connected to the circuit ground, and their drains are each connected to the pad node 250. A pullup resistor 220 is connected between the pad node 250 and a high-voltage source $V_{DD}$.

In operation, when the input signal DATA is low, the pad is to be driven low, and the signal is high, the pad is to be driven high. When the input signal DATA undergoes a high-to-low transition, the output of the inverter 210 transitions from low-to-high, and accordingly, a low-to-high transition is applied to the gates of low- and high-voltage NFETs $N2_{LV}$ and $N2_{HV}$, whereby both of them eventually fully conduct and pull the output pad 230 to ground. When the input signal DATA undergoes a low-to-high transition, the output of the inverter 210 transitions from high-to-low, which is applied to the gates of low- and high-voltage NFETs $N2_{LV}$ and $N2_{HV}$, whereby both of them eventually are turned off to isolate the output pad 230 from ground, allowing pull-up resistor 220 to pull the output pad 230 to $V_{DD}$. The use of parallel low- and high-voltage transistors results in a staged level of conductance similar to the timing diagram of FIGS. 3A and 3B.

FIG. 5 illustrates an exemplary embodiment of a method 50 in accordance with the invention for implementing a circuit for controlling the slew rate of output drivers by using transistors with differing threshold voltages to achieve a stepped-stage slew rate on the edges of the signal transitions. As illustrated, in accordance with the method 50, a first switchably conductive device characterized by a first threshold voltage and having a switch control connected to a driving voltage is connected 52 between the output pad node and a source. A second or more switchably conductive device each characterized by a different threshold voltage and having a switch control connected 54 to the driving voltage is connected in parallel with the first switchably conductive device between the output pad node and a source. A driving voltage is connected 56 to each of the control switches of the first and second or more switchably conductive devices.

FIG. 6 illustrates a method 60 of operation of a circuit built in accordance with FIG. 5. As illustrated, the driving voltage driving the switch control of the first and second or more switchably conductive devices is monitored 62. When the driving voltage transitions 64 in a first direction to reach 66 the first threshold voltage, the first switchably conductive device is turned on 68. When the driving voltage reaches 70 the next higher threshold voltage of the devices, the switchably conductive device associated with the next higher threshold voltage is turned on 72. Steps 70 and 72 are repeated for each additional switchably conductive device. When the driving voltage transitions in a second direction to reach 74 the second or highest threshold voltage, the second or associated switchably conductive device is turned off 76. When the driving voltage continues in the second direction and reaches 78 the first or next lowest threshold voltage, the first or associated switchably conductive devices is also turned off 80. Steps 78 and 80 are repeated for each additional switchably conductive device.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for reducing the slew rate of transition edges of a digital signal on an output pad of an integrated circuit, comprising:

connecting a first switchably conductive device characterized by a first threshold voltage of a given polarity between said output pad of said integrated circuit and a voltage source, said first switchably conductive device having a control input connected to a first input signal to allow current conduction from said voltage source to said output pad of said integrated circuit when a voltage level of said first input signal is equal to and greater than said first threshold voltage and to disallow said current conduction when said voltage level of said first input signal is less than said first threshold voltage;

connecting a second switchably conductive device independent from said first switchably conductive device and characterized by a second threshold voltage of said given polarity greater than said first threshold voltage between said output pad of said integrated circuit and said voltage source, said second switchably conductive device having a control input connected to a second input signal to allow current conduction from said voltage source to said output pad of said integrated circuit when a voltage level of said second input signal is equal to and greater than said second threshold voltage and to disallow said current conduction when said voltage level of said second input signal is less than said second threshold voltage;

connecting between said output pad of said integrated circuit and said voltage source one or more additional independent switchably conductive devices each characterized by a respective threshold voltage of said given polarity but different than said first threshold voltage, said second threshold voltage, and each other respective threshold voltage, each said one or more additional switchably conductive devices having a respective control input connected to a respective input signal to allow current conduction from said voltage source to said output pad of said integrated circuit when a voltage level of said respective input signal is equal to and greater than said respective threshold voltage and to disallow said current conduction when said voltage level of said respective input signal is less than said respective threshold voltage; and connecting a driving signal as said first input signal of said first switchably conductive device and as said second input signal of said second switchably conductive device and as said respective input signal of said respective switch of each of said respective one or more additional switchably conductive devices;

wherein said first switchably conductive device, said second switchably conductive device, and said respective one or more additional independent switchably conductive devices together operate to control the slew rate of said output signal driven onto said output pad of said integrated circuit using a step-controlled edge transition.

2. An output driver that drives an output signal onto an output pad of an integrated circuit, comprising:

a first switchably conductive device characterized by a first threshold voltage of a given polarity, said first switchably conductive device coupled between said output pad of said integrated circuit and a voltage source and having a control input connected to a driving signal to allow current conduction from said voltage source to said output pad when a voltage level of said driving signal is equal to and greater than said first threshold voltage and to disallow said current conduction when said voltage level of said driving signal is less than said first threshold voltage; and a second switchably conductive device independent from said first switchably conductive device characterized by a second threshold voltage of said given polarity greater than said first threshold voltage, said second switchably conductive device coupled between said output pad of said integrated circuit and said voltage source and having a control input connected to said driving signal to allow current conduction from said voltage source to said output pad when a voltage level of said driving signal is equal to and greater than said second threshold voltage and to disallow said current conduction when said voltage level or said driving signal is less than said second threshold voltage;

one or more additional independent switchably conductive devices each characterized by a respective threshold voltage of said given polarity but different than said first threshold voltage, said second threshold voltage, and each other respective threshold voltage, each said one or more additional independent switchably conductive devices connected between said output pad and said voltage source and having a respective control input connected to said driving signal to allow current conduction from said voltage source to said output pad when said voltage level of said driving signal is equal to and greater than said respective threshold voltage and to disallow said current conduction when said voltage level of said driving signal is less than said respective threshold voltage;

wherein said first switchably conductive device, said second switchably conductive device, and said respective one or more additional independent switchably conductive devices together operate to control the slew rate of said output signal driven onto said output pad of said integrated circuit using a step-controlled edge transition.

3. An output driver in accordance with claim 2, wherein said first switchably conductive device comprises a single field effect transistor (FET) and single second switchably conductive device comprises a single field effect transistor (FET).

4. An output driver in accordance with claim 2, wherein said first switchably conductive device comprises a single field effect transistor (FET) and single second switchably conductive device comprises a single field effect transistor (FET), and said one or more additional switchably independent conductive devices each comprises a single field effect transistor (FET).

5. A method for controlling the slew rate of transition edges of a digital signal on an output pad of an integrated circuit, said method comprising the steps of:

driving, with a driving signal, a first switchably conductive device characterized by a first threshold voltage of a given polarity and connected between said output pad of said integrated circuit and a voltage source, said first switchably conductive device having a control input connected to said driving signal to allow current conduction from said voltage source to said output pad of said integrated circuit when a voltage level of said driving signal is equal to and greater than sold first threshold voltage and to disallow said current conduction when said driving signal is less than said first threshold voltage;

driving, with said driving signal, a second switchably conductive device independent from said first switchably conductive device characterized by a second threshold voltage of said given polarity greater than said first threshold voltage and connected between said output pad of said integrated circuit and said voltage source, said second switchably conductive device having a control input connected to said driving signal to allow current conduction from said voltage source to said output pad of said integrated circuit when said voltage level of said driving signal is equal to and greater than said second threshold voltage and to disallow said current conduction when said voltage level of said driving signal is less than said second threshold voltage; and driving, with said driving signal, one or more additional independent switchably conductive devices each characterized by a respective threshold voltage of said given polarity but different than said first threshold voltage, said second threshold voltage, and each other respective threshold voltage, each said one or more additional independent switchably conductive devices connected between said output pad and said voltage source and having a respective control input connected to said driving signal to allow current conduction from said voltage source to said output pad when said voltage level of said driving signal is equal to and greater than said respective threshold voltage and to disallow said current conduction when said voltage level of said driving signal is less than said respective threshold voltage;

wherein said first switchably conductive device, said second switchably conductive device, and said respective one or more additional independent switchably conductive devices together operate to control the slew rate of said output signal driven onto said output pad of said integrated circuit using a step-controlled edge transition.

6. A method for reducing the slew rate of transition edges of a digital signal on an output pad of an integrated circuit, comprising:

connecting a first switchably conductive device characterized by a first threshold voltage of a given polarity between said output pad of said integrated circuit and a voltage source, said first switchably conductive device having a control input connected to a first input signal to allow current conduction from said voltage source to said output pad of said integrated circuit when a voltage level of said first input signal is equal to and less than said first threshold voltage and to disallow said current conduction when said voltage level of said first input signal is greater than said first threshold voltage;

connecting a second switchably conductive device independent from said first switchably conductive device characterized by a second threshold voltage of said given polarity loss than said first threshold voltage between said output pad of said integrated circuit and said voltage source, said second switchably conductive device having a control input connected to a second input signal to allow current conduction from said voltage source to said output pad of said integrated circuit when a voltage level of said second input signal is equal to and less than said second threshold voltage and to disallow said current conduction when said voltage level of said second input signal is greater than said second threshold voltage;

connecting between said output pad of said integrated circuit and said voltage source one or more additional independent switchably conductive devices each characterized by a respective threshold voltage of said given polarity but different than said first threshold voltage, said second threshold voltage, and each other respective threshold voltage, each said one or more additional switchably conductive devices having a respective control input connected to a respective input signal to allow current conduction from said voltage source to said output pad of said integrated circuit when a voltage level of said respective input signal is equal to and less than said respective threshold voltage and to disallow said current conduction when said voltage level of said respective input signal is greater than said respective threshold voltage; and connecting a driving signal as said first input signal of said first switchably conductive device and as said second input signal of said second switchably conductive device and as said respective input signal of said respective switch of each of said respective one or more additional switchably conductive devices;

wherein said first switchably conductive device, said second switchably conductive device, and said respective one or more additional independent switchably conductive devices together operate to control the slew rate of said output signal driven onto said output pad of said integrated circuit using a step-controlled edge transition.

7. An output driver that drives an output signal onto an output pad of an integrated circuit, comprising:

a first switchably conductive device characterized by a first threshold voltage of a given polarity, said first switchably conductive device connected between said output pad of said integrated circuit and voltage source and having a control input connected to a driving signal to allow current conduction from said voltage source to said output pad of said integrated circuit when a voltage level of said driving signal is equal to and less than said first threshold voltage and to disallow said current conduction when said voltage level of said driving signal is greater than said first threshold voltage; and a second switchably conductive device independent from said first switchably conductive device characterized by a second threshold voltage of said given polarity less than said first threshold voltage, said second switchably conductive device connected between said output pad of said integrated circuit and said voltage source and having a control input connected to said driving signal to allow current conduction from said voltage source to said output pad of said integrated circuit when a voltage level of said driving signal is equal to and less than said second threshold voltage and to disallow said current conduction when said voltage level of said driving signal is greater than said second threshold voltage;

one or more additional independent switchably conductive devices each characterized by a respective threshold voltage of said given polarity but different than said first threshold voltage, said second threshold voltage, and each other respective threshold voltage, each said one or more additional switchably conductive devices connected between said output pad of said integrated circuit and said voltage source and having a respective control input connected to said driving signal to allow current conduction from said voltage source to said output pad of said integrated circuit when said voltage level of said driving signal is equal to and less than said respective threshold voltage and to disallow said current conduction when said voltage level of said driving signal is greater than said respective threshold voltage;

wherein said first switchably conductive device, said second switchably conductive device, and said respective one or more additional independent switchably conductive devices together operate to control the slew rate of said output signal driven onto said output pad of said integrated circuit using a step-controlled edge transition.

8. An output driver in accordance with claim 7, wherein said first switchably conductive device comprises a single field effect transistor (FET) and single second switchably conductive device comprises a single field effect transistor (FET).

9. An output driver in accordance with claim 7, wherein said first switchably conductive device comprises a single field effect transistor (FET) and single second switchably conductive device comprises a single field effect transistor (FET), and said one or more additional switchably conductive devices each comprises a single field effect transistor (FET).

10. A method for controlling the slew rate of transition edges of a digital signal on an output pad of an integrated circuit, said method comprising the steps of:

driving, with a driving signal, a first switchably conductive device characterized by a first threshold voltage of a given polarity and connected between said output pad of said integrated circuit and a voltage source, said first switchably conductive device having a control input connected to said driving signal to allow current conduction from said voltage source to said output pad of said integrated circuit when a voltage level of said driving signal is equal to and less than said first threshold voltage and to disallow said current conduction when said driving signal is greater than said first threshold voltage;

driving, with said driving signal, a second switchably conductive device independent from said first switchably conductive device characterized by a second threshold voltage of said given polarity less than said first threshold voltage and connected between said output pad of said integrated circuit and said voltage source, said second switchably conductive device having a control input connected to said driving signal to allow current conduction from said voltage source to said output pad of said integrated circuit when said voltage level of said driving signal is equal to and less than said second threshold voltage and to disallow said current conduction when said voltage level of said driving signal is greater than said second threshold voltage; and driving, with said driving signal, one or more additional independent switchably conductive devices each characterized by a respective threshold voltage of said given polarity but different than said first threshold voltage, said second threshold voltage and each other respective threshold voltage, each said one or more additional independent switchably conductive devices connected between said output pad and said voltage source and having a respective control input connected to said driving signal to allow current conduction from said voltage source to said output pad when said voltage level of said driving signal is equal to and less than said respective threshold voltage and to disallow said current conduction when said voltage level of said driving signal is greater than said respective threshold voltage;

wherein said first switchably conductive device, said second switchably conductive device, and said respective one or more additional independent switchably conductive devices together operate to control the slew rate of said output signal driven onto said output pad of said integrated circuit using a step-controlled edge transition.

11. An output driver that drives an output signal onto an output pad of an integrated circuit, comprising:

a first field effect transistor (FET) device characterized by a first threshold voltage of a given polarity, said first FET device having a source connected to a voltage source, a drain connected to said output pad of said integrated circuit, and a gate coupled to a driving signal;

a second FET device characterized by a second threshold voltage of said given polarity and different than said first threshold voltage, said second FET device having a source connected to said voltage source, a drain connected to said output pad of said integrated circuit, and a gate coupled to said driving signal;

one or more additional FET devices each characterized by a respective threshold voltage of said given polarity but different than said first threshold voltage, said second threshold voltage, and each other respective threshold voltage, each said one or more additional FET devices having a source connected to said voltage source, a drain connected to said output pad of said integrated circuit, and a gate coupled to said driving signal;

wherein said first FET device, said second FET device, and said respective one or more additional FET devices together operate to control the slew rate of said output signal driven onto said output pad of said integrated circuit using a step-controlled edge transition.

12. A method for reducing the slew rate of transition edges of a digital signal on an output pad of an integrated circuit, comprising:

connecting a source of a first field effect transistor (FET) device to a voltage source, a drain of said first FET device to said output pad of said integrated circuit, and a gate of said first FET device to a driving signal, said first FET device characterized by a first threshold voltage of a given polarity;

connecting a source of a second field effect transistor (FET) device to said voltage source, a drain of said second FET device to said output pad of said integrated circuit, and a gate of said second FET device to said driving signal, said first FET device characterized by a second threshold voltage of said given polarity but different than said first threshold voltage; and connecting respective sources of one or more additional field effect transistor (FET) devices to said voltage source, respective drains of said one or more additional FET devices to said output pad of said integrated circuit, and respective gates of said one or more additional FET devices to said driving signal, said one or more additional FET devices each characterized by a respective threshold voltage of said given polarity but different than said first threshold voltage, said second threshold voltage, and each other respective threshold voltage;

wherein said first FET device, said second FET device, and said one or more additional FET devices together operate to control the slew rate of said output signal driven onto said output pad of said integrated circuit using a step-controlled edge transition.

13. A method for controlling the slew rate of transition edges of a digital signal on an output pad of an integrated circuit, said method comprising the steps of:

driving a gate of a first field effect transistor (FET) device with a driving signal, said first FET device characterized by a first threshold voltage of a given polarity and having a source connected to voltage source and a drain connected to said output pad of said integrated circuit; and driving a gate of a second field effect transistor (FET) device with a said driving signal, said second FET device characterized by a second threshold voltage of said given polarity and different than said first threshold voltage and having a source connected to voltage source and a drain connected to said output pad of said integrated circuit;

driving a gate of one or more additional field effect transistor (FET) devices with said driving signal, said one or more additional FET devices characterized by a respective threshold voltage of said given polarity but different than said first threshold voltage, said second threshold voltage, and each other respective threshold voltage;

wherein said first FET device, said second FET device, and said one or more additional FET devices together operate to control the slew rate of said output signal driven onto said output pad of said integrated circuit using a step-controlled edge transition.

* * * * *